United States Patent
Carminati (10) Patent No.: US 11,249,133 B2
(45) Date of Patent: Feb. 15, 2022

(54) DETERMINATION OF THE DISPERSION OF AN ELECTRONIC COMPONENT

(71) Applicant: STMicroelectronics (Crolles 2) SAS, Crolles (FR)

(72) Inventor: Yann Carminati, Saint Pierre d'Albigny (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 50 days.

(21) Appl. No.: 16/745,813

(22) Filed: Jan. 17, 2020

(65) Prior Publication Data
US 2020/0233032 A1 Jul. 23, 2020

(30) Foreign Application Priority Data
Jan. 22, 2019 (FR) ...................... 1900530

(51) Int. Cl.
| | | |
|---|---|---|
| *G01R 31/28* | (2006.01) | |
| *G01R 31/3183* | (2006.01) | |
| *G01R 31/319* | (2006.01) | |
| *G01R 31/30* | (2006.01) | |
| *G08C 15/04* | (2006.01) | |
| *G05B 11/01* | (2006.01) | |

(52) U.S. Cl.
CPC ..... *G01R 31/2884* (2013.01); *G01R 31/3016* (2013.01); *G01R 31/31922* (2013.01); *G01R 31/318328* (2013.01); *G05B 11/012* (2013.01); *G08C 15/04* (2013.01)

(58) Field of Classification Search
CPC ............ G01R 31/2884; G01R 31/3016; G01R 31/318328; G01R 31/31922; G01R 31/2894; G01R 31/2882; G01R 31/2856; G08C 15/04; G05B 11/012
See application file for complete search history.

(56) References Cited

U.S. PATENT DOCUMENTS

| | | | | | |
|---|---|---|---|---|---|
| 4,712,061 | A | * | 12/1987 | Lach | G01R 25/00 324/617 |
| 5,097,208 | A | * | 3/1992 | Chiang | G01R 29/0273 324/537 |
| 6,134,191 | A | * | 10/2000 | Alfke | G01R 31/3016 324/73.1 |

(Continued)

FOREIGN PATENT DOCUMENTS

EP    0311237 A2    4/1989

OTHER PUBLICATIONS

S. I. Long, "Test structures for propagation delay measurements on high-speed integrated circuits," in IEEE Transactions on Electron Devices, vol. 31, No. 8, pp. 1072-1076, Aug. 1984. (Year: 1984).*

(Continued)

*Primary Examiner* — Cynthia Britt
(74) *Attorney, Agent, or Firm* — Crowe & Dunlevy (57) ABSTRACT

A value representative of a dispersion of a propagation delay of assemblies of electronic components is determined. A component test structure includes stages of components and a logic circuit connected in a ring. Each stage includes two assemblies of similar components configured to conduct a signal. A test device is configured to obtain values of the component test structure and to perform operations on these values.

20 Claims, 6 Drawing Sheets

(56) References Cited

U.S. PATENT DOCUMENTS

| | | |
|---|---|---|
| 8,224,604 B1 | 7/2012 | Amrutur et al. |
| 2003/0204743 A1 | 10/2003 | Devadas et al. |
| 2007/0110194 A1 | 5/2007 | de Obaldia et al. |

OTHER PUBLICATIONS

Chae Kwanyeob et al: "Tier Adaptive Body Biasing: A Post-Silicon Tuning Method to Minimize Clock Skew Variations in 3-D ICs", IEEE Transactions on Components, Packaging and Manufacturing Technology, IEEE, USA, vol. 3, No. 10, Oct. 1, 2013 (Oct. 1, 2013), pp. 1720-1730, XP011528382, ISSN: 2156-3950, DOI: 10.1109/TCPMT.2013.2238581 [extrait le Sep. 30, 2013] * I. Introduction ; III. Tier-Adaptive Body Biasing *.

Das Bishnu Prasad et al: "On-chip Measurement of Rise/Fall Gate Delay Using Reconfigurable Ring Oscillator" IEEE Transactions on Circuits and Systems II: Express Briefs, IEEE, US, vol. 61, n°3, Mar. 1, 2014 (Mar. 1, 2014), pp. 183-187, XP011543074, ISSN: 1549-7747, DOI: 10.1109/TCSII.2013.2296118 [extrait le Sep. 30, 2013] * I. Introduction ; III. Tier-Adaptive Body Biasing *.

Whitcombe, Amy et al: "On-Chip I-V Variability and Random Telegraph Noise Characterization in 28 nm CMOS," 2016 IEEE, pp. 248-251.

INPI Search Report and Written Opinion for FR 1900530 dated Nov. 27, 2019 (13 pages).

* cited by examiner

DETERMINATION OF THE DISPERSION OF AN ELECTRONIC COMPONENT

PRIORITY CLAIM

This application claims the priority benefit of French Application for Patent No. 1900530, filed on Jan. 22, 2019, the content of which is hereby incorporated by reference in its entirety to the maximum extent allowable by law.

TECHNICAL FIELD

The present disclosure generally concerns a method of determining the dispersion of a characteristic of electronic components.

BACKGROUND

On manufacturing of electronic components, variations in the value of certain characteristics may appear. More particularly, certain values of characteristics may vary over all the components. It may be useful to determine statistical quantities enabling to characterize the generated inaccuracy.

SUMMARY

An embodiment provides a device for determining a value representative of the dispersion of a propagation delay of assemblies of electronic components, the device comprising: at least one component test structure, each test structure comprising stages of components and a logic circuit connected in a ring, each stage comprising two assemblies of similar components configured to conduct a signal; and a test device configured to obtain values of the at least one array and to perform operations on these values.

According to an embodiment, the device comprises an electronic chip wafer, each chip comprising at least one of the test structures.

According to an embodiment, each test structure comprises four terminals of connection with the test device and two power supply terminals.

According to an embodiment, each stage comprises a comparator, a memory circuit configured to store data, and a multiplexer.

According to an embodiment, the comparator is formed from the components of the assemblies.

According to an embodiment, at least a portion of the multiplexer is formed from the components of the assemblies.

Another embodiment provides a method of determining a value representative of the dispersion of a propagation delay of assemblies of electronic components, comprising calculating the difference between the sum of the longest propagation delays of each pair among pairs of component assemblies and the sum of the shortest propagation delays in each pair among the pairs of component assemblies.

According to an embodiment, the method is implemented by a device such as previously described, each pair of assemblies being the two assemblies of components of a stage.

According to an embodiment, the value representative of the dispersion is obtained by the following formula (Equation 1):

$$D = \frac{1}{N}\left(\sum_{i=1}^{N} ai - \sum_{i=1}^{N} bi\right)$$

where N is equal to the number of stages, and where values ai and bi are, for a pair of component assemblies i, the propagation delays of the component assemblies, value ai being greater than value bi.

According to an embodiment, the method comprises a step during which a signal is sent into the stages, the comparator of each stage determining the path where the signal propagates faster and stores this information in the memory circuit.

According to an embodiment, the method comprises: generating a periodic signal running through the stages, the multiplexer of each stage being configured to conduct the signal through one among the assembly having the longest propagation delay and the assembly having the shortest propagation delay, the signal having a first oscillation period value after a passage through all the stages; and generating a periodic signal running through the stages, the multiplexer of each stage being configured to conduct the signal into the other one among the assembly having the longest propagation delay and the assembly having the shortest propagation delay, the signal having a second oscillation period value after a passage through all the stages.

According to an embodiment, the test device calculates the value representative of the dispersion of the propagation delay from the first and second values.

According to an embodiment, each assembly of components belongs to a single pair of assemblies.

According to an embodiment, part of the operations of calculation of the value representative of the dispersion is performed by the components.

According to an embodiment, the value representative of the dispersion is obtained by the following formula (Equation 2):

$$D = \frac{1}{N}\left(\sum_{i=1}^{N} ai - \sum_{i=1}^{N} bi\right)$$

where N is equal to the number of pairs of component assemblies, and where values ai and bi are, for a pair of component assemblies i, the propagation delays of the component assemblies, value ai being greater than value bi.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the applications of the chips and of the components located on the chips are not described.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements. In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

Figure 1:
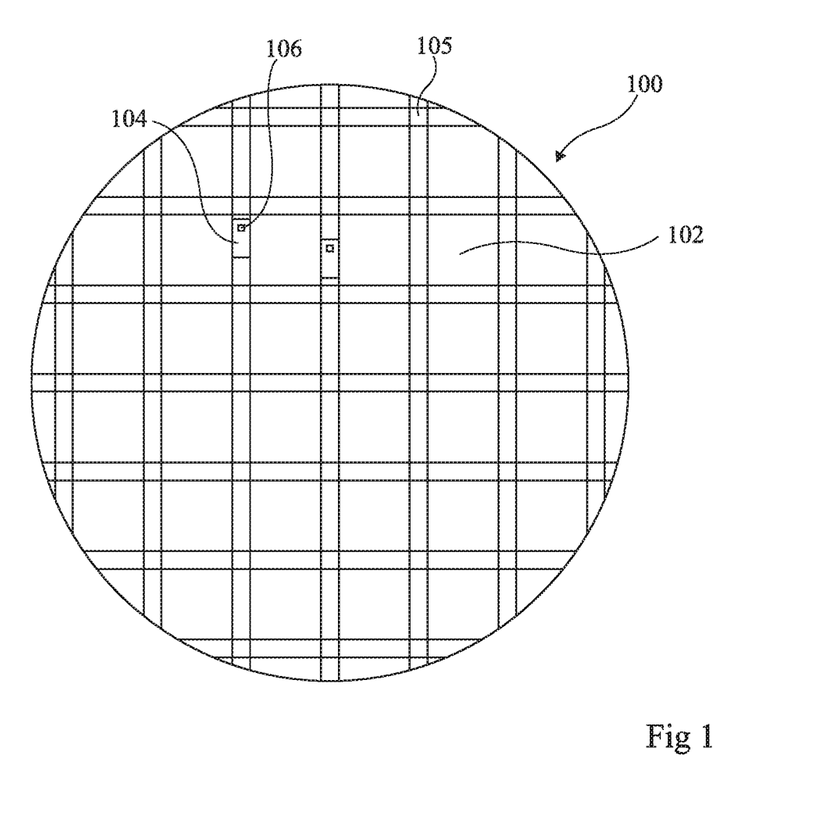
FIG. 1 shows an embodiment of an electronic chip wafer.

FIG. 1 shows an embodiment of a wafer 100 of electronic chips 102. The electronic chips comprise electronic components, for example, transistors.

On manufacturing of the wafer, and thus of the chips, a variation of certain characteristics may appear. For example, certain characteristics may have a different value at the periphery of the wafer and at the center of the wafer. This variation may thus be desired to be quantified, for example by calculating statistical quantities representative of the variation.

It is, for example, possible to measure a characteristic of one or a plurality of electronic components in a plurality of locations of a wafer and to calculate an average of the values of this characteristic. However, it may also be useful to have a value representative of the dispersion of the values of the characteristic. The characteristic is, for example, the propagation delay.

Quantities representative of the dispersion of a value for example include the standard deviation and the Gini mean difference.

Standard deviation σ is defined by the following formula (Equation 3):

$$\sigma = \sqrt{\frac{1}{M}\sum_{i=1}^{M}(xi-mx)^2}$$

where xi is the propagation delay of an assembly of components, M is the total number of component assemblies, and mx is the average of the values of the propagation delays The Gini mean difference MD is defined by the following formula (Equation 4):

$$MD = \frac{1}{M^2}\sum_{i=1}^{M}\sum_{j=1}^{M}|xi-xj|$$

where M is then number of considered assemblies of electronic components and xi is the propagation delay of assembly i.

To limit calculations while obtaining a value representative of the dispersion, it is provided to calculate a value D by the following formula (Equation 5):

$$D = \frac{2}{M}\sum_{i=1}^{M/2}|x_{2i}-x_{2i-1}|$$

where M is the number of considered electronic component assemblies and xi is the propagation delay of assembly i.

Value D corresponds to the sum of the differences between pairs of values xi, that is, between the propagation delays of pairs of component assemblies, divided by the number of pairs. Each component assembly belongs to a single pair of assemblies.

Value D may also be calculated by the following formula (Equation 6):

$$D = \frac{2}{M}\left(\sum_{i=1}^{M/2}ai - \sum_{i=1}^{M/2}bi\right)$$

where M is the number of component assemblies and, for each pair of component assemblies, ai is the highest value of the two propagation delays of the assemblies in the pair, and bi is the lowest value of the two propagation delays of the assemblies in the pair.

For each pair of assemblies, value ai is greater than value bi. Thus, subtracting value bi from value ai always generates a positive value. This enables to avoid calculating the absolute value present in formula Equation 5.

Each electronic chip 102 of wafer 100 comprises one or a plurality of test structures 104. Each test structure is associated with part of the elementary electronic components of the chip. In the example of FIG. 1, the test structures are arrays located in the sawing paths 105 (i.e., scribe lines) of wafer 100. They will thus be removed, or destroyed, on sawing the wafer to produce individual chips 102.

As a variation, the test structures may be components located inside of the chip 102. Such components may then be present in the final chip at the end of the manufacturing.

Each test structure, that is, each array, comprises electronic components used, for example, only to test the components manufactured on wafer 100. It is considered that the behavior of the electronic components of array 104 is representative of the behavior of all the electronic components of chip 102.

In the example of FIG. 1, two arrays are shown in the sawing paths around one of chips 102. The number and the dimensions of the test structures may however vary.

Array 104 of chip 102 further comprises four connection terminals 106, a single connection terminal being shown, allowing the connection of the array to one or a plurality of elements external to the array, for example, external to the chip. Preferably, the array only comprises four connection terminals. The connection terminals, for example, enable to connect the array to a test device, not shown. Each test structure 104 comprises more than two power supply terminals.

The test device, not shown, may deliver, through the connection terminals, control signals to the chip. The device is further configured to obtain values supplied by the chip through a connection terminal. The test device is further configured to perform operations from the obtained values.

Figure 2:
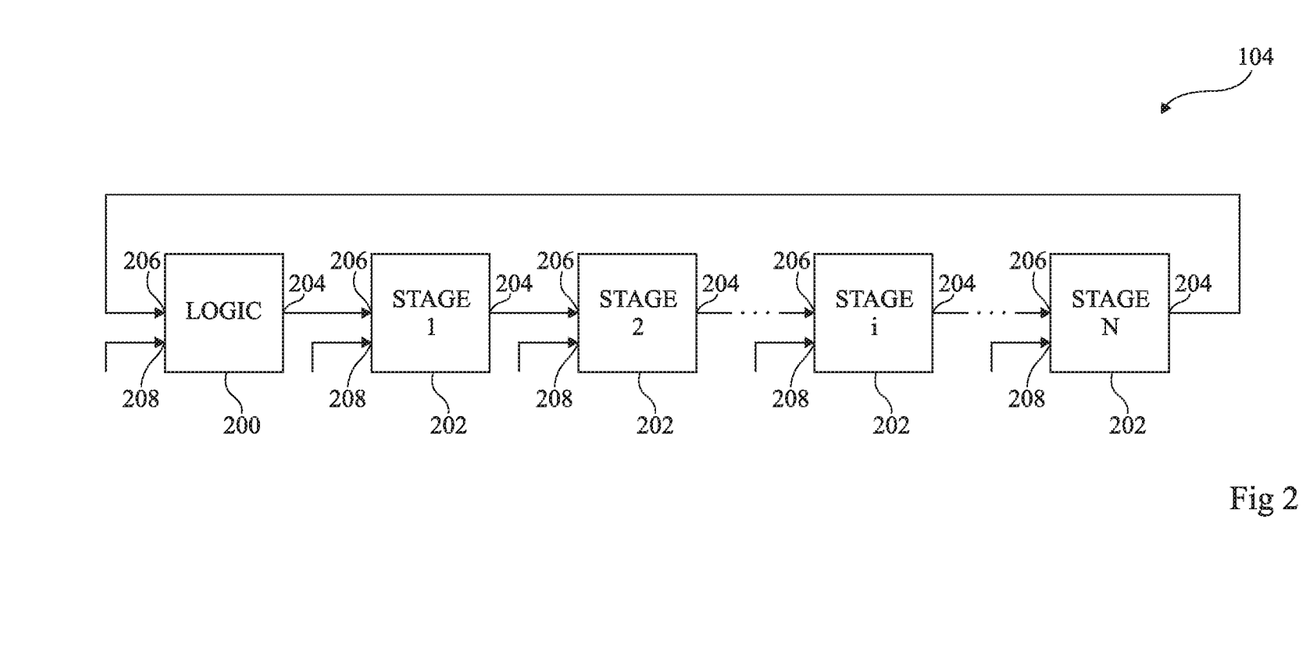
FIG. 2 illustrates an embodiment of a device for determining the dispersion.

FIG. 2 schematically illustrates an embodiment of a dispersion determination device. More particularly, FIG. 2 illustrates an array 104. Array 104 is configured to be able to implement a dispersion determination method and more particularly to be able to implement at least part of the calculation of formula Equation 6.

Array 104 comprises a logic circuit 200 used to implement the dispersion determination method. Array 104 further comprises stages 202 (STAGE 1, STAGE 2, STAGE i, STAGE N) of components. In the example of FIG. 2, array 104 comprises N stages, stage i here representing any stage between stage STAGE 2 and stage STAGE N.

Logic circuit 200 and stages STAGE 1 to STAGE N are coupled to form a ring. In particular, an output 204 of logic circuit 200 is coupled to an input 206 of the first stage, stage STAGE 1, and an input 206 of logic circuit 200 is coupled to an output 204 of the last stage, stage STAGE N. Further, an output 204 of each stage between first stage STAGE 1 and the penultimate stage STAGE N−1 (not shown) is coupled to an input 206 of the next stage.

Wafer 100 (FIG. 1) for example comprises between fifty and one hundred chips 102, for example, eighty chips. The array 104 of each chip 102 for example comprises between fifty and five hundred stages (N in the range from 50 to 500), for example, four hundred (N=400).

Logic circuit 200 and each of stages 202 receives on an input 208 one or a plurality of data originating from the test device coupled to connection terminals 106 (FIG. 1). The inputs 208 of stages 202 are for example coupled to receive the same data.

Figure 3:
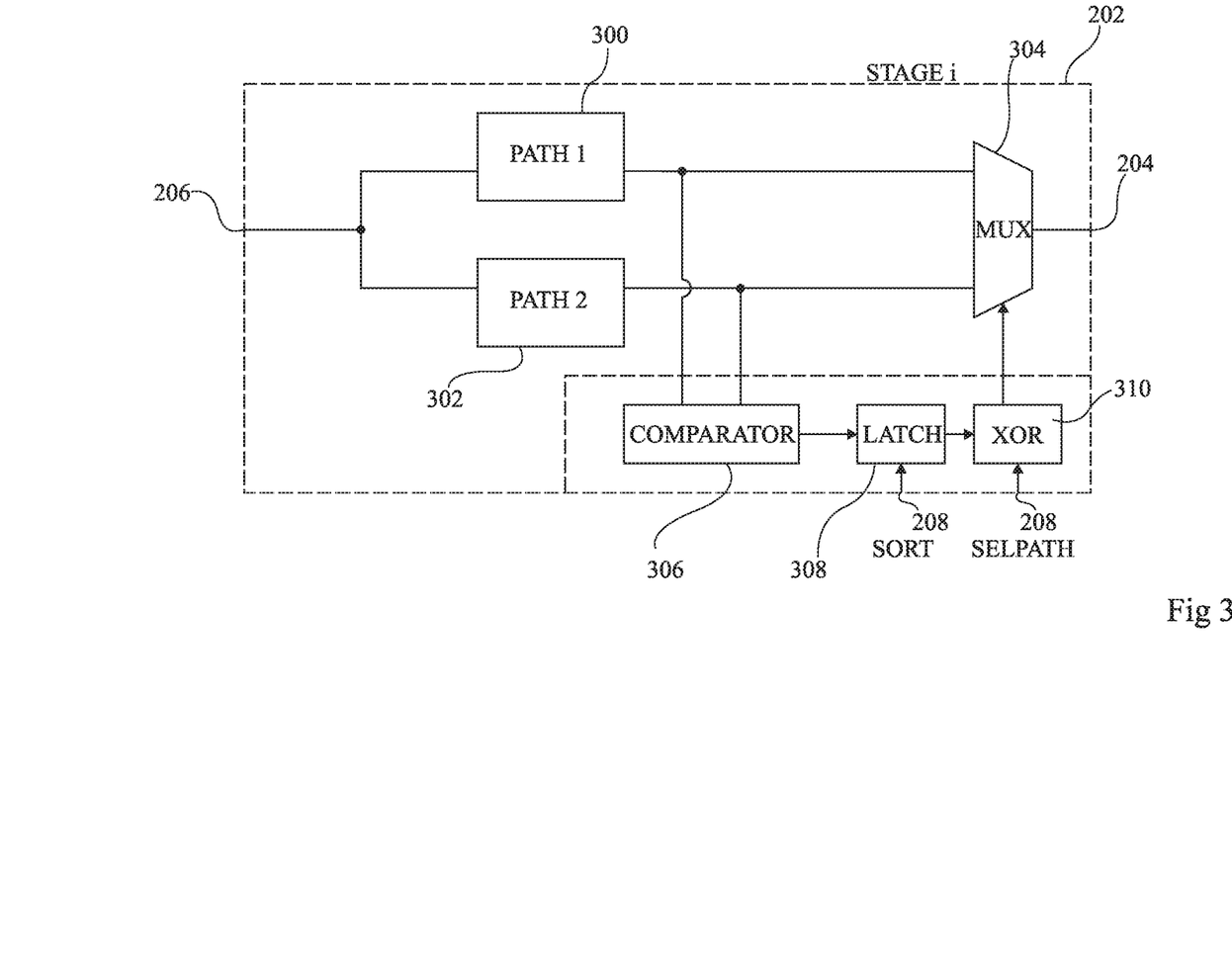
FIG. 3 illustrates in more detailed fashion a portion of the device of FIG. 2.

FIG. 3 illustrates in further detail in the form of blocks a portion of the device of FIG. 2. In particular, FIG. 3 shows in more detailed fashion a stage 202 which may be any stage among stages STAGE 1 to STAGE N, here called STAGE i.

Stage 202 comprises a first path 300 (PATH1) and a second path 302 (PATH2). Each of the first and second paths comprises electronic components, for example, logic gates formed by transistors. The first and second paths are similar, that is, they comprise the same electronic components coupled in the same way. However, the first and second paths may have different characteristics, for example resulting from the manufacturing method. In particular, the first and second paths introduce a different delay when a signal runs through stage STAGE i.

An input of each of the first and second paths is coupled, preferably connected, to input 206 of stage STAGE i. An output of each of the first and second paths is coupled, preferably connected, to an input of a multiplexer 304 (MUX). An output of the multiplexer is coupled, preferably connected, to output 204 of stage STAGE i.

Stage 202 comprises a comparator 306 (COMPARATOR), for example coupled, preferably connected, to the outputs of the first and second paths. Comparator 306 is configured to determine which of the paths introduces the longest delay in a signal running through the stage, as will be described in further detail in relation with FIG. 4.

Stage 202 further comprises a memory circuit 308 (LATCH) configured to store data. Memory circuit 308 is configured to store data indicating which path is the slowest, that is, which path introduces the longest delay on transmission of a signal.

Stage 202 further comprises a circuit 310 (XOR) coupled to circuit 308. An output of circuit 310 is connected to the selection input of multiplexer 304. Circuit 310 for example is a logic gate, for example, an XOR gate. Circuit 310 enables to determine what input signal of multiplexer 304 should be transmitted, based on the data contained in circuit 308 and on data SELPATH supplied via input 208, for example, by the test device, not shown, or by logic circuit 200 (FIG. 2).

Figure 4:
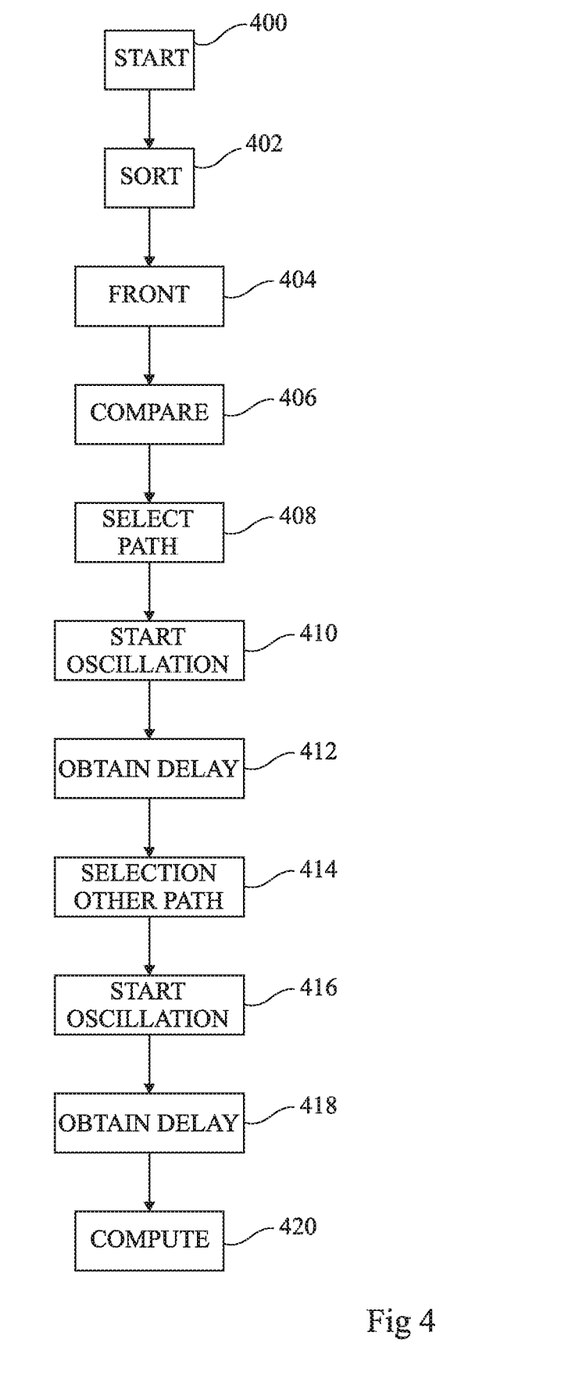
FIG. 4 illustrates an embodiment of a dispersion determination method configured to be applied to the device of FIG. 2.

FIG. 4 illustrates an embodiment of a method of determining the dispersion that can be applied to the device of FIG. 2. More particularly, the described method may be carried out sequentially on all the arrays of the chips 102 of wafer 100.

During step 400 (START), a test device is coupled to connection terminals 106 (FIG. 1).

During step 402 (SORT), a comparison activation signal is supplied by the test device to the test structure, via a first terminal 106 (FIG. 1), for example, to the comparator 306 (FIG. 3) of each stage. The comparison activation signal enables to activate the comparator.

During step 404 (FRONT), a signal for example comprising a single edge, for example, a rising edge, is sent from circuit 200 (FIG. 2) into stages 202. The signal is for example generated by circuit 200 when all comparators have been activated. The rising edge crosses the different stages 202 one after the others, starting from stage STAGE 1 and ending with stage STAGE N. For each stage, the signal comprising the rising edge follows the first and second paths 300 and 302.

During step 406 (COMPARE), comparator 306, having for example received signal SORT, compares the signals coming out of the first and second paths and determines which one arrives first. Thus, the comparator determines which path generates the longest propagation delay. This information is stored in circuit 308 (LATCH). Circuit 308 for example stores binary data, for example, a single binary datum. For example, the value of the binary datum is a high value (for example, 1) when the edge is detected first on path 300 and is a low value (for example, 0) when the edge is detected first on path 302.

During step 408 (SELECT PATH), a signal SELPATH, for example, a binary signal, is delivered to the test structure, for example, by the test device via a second terminal 106. The signal is transmitted to each stage 202, for example, to the circuit 310 of each stage.

It is considered in the present example that the circuit 310 of each stage configures multiplexer 304 to direct the signal through the path causing the longest propagation delay, according to signal SELPATH (which is then for example equal to 0) and to the data contained in circuit 308. As a variation, the circuit 310 of each stage could configure at step 408 multiplexer 304 to direct the signal through the path causing the shortest propagation delay.

During step 410 (START OSCILLATION), a signal START OSCILLATION, for example, a rising edge, is transmitted to circuit 200, for example, via a third terminal 106. This signal causes the generation of a pulse by circuit 200. The pulse is then delivered at the input of stage STAGE 1 and crosses all the stages before returning to circuit 200, which generates a new pulse, for example, similar to the previous pulse. An oscillating signal is thus created.

Figure 5:
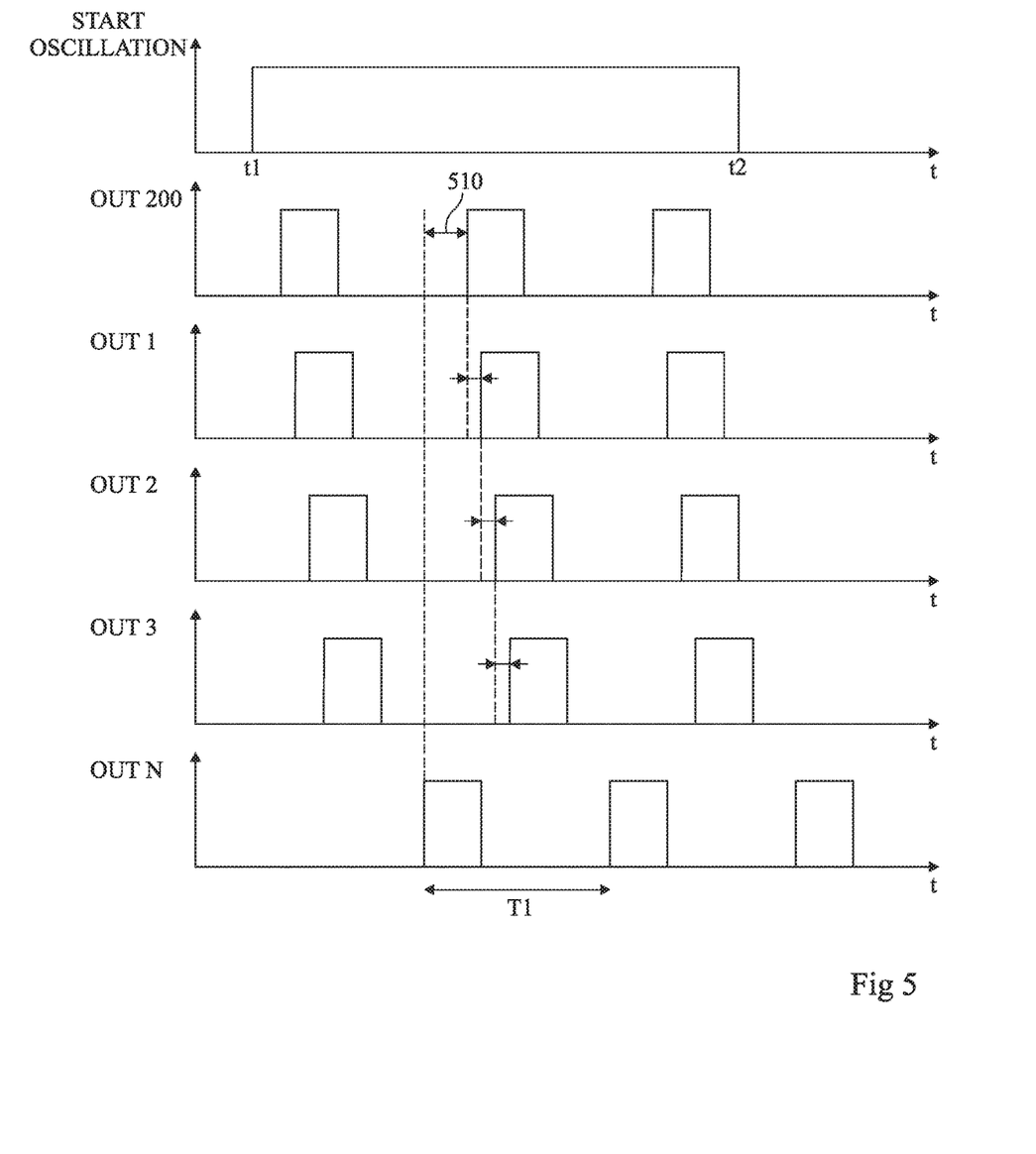
FIG. 5 illustrates a control signal and output signals of elements of the device of FIG. 2, versus time, during a step of the method of FIG. 4.

FIG. 5 illustrates signal START OSCILLATION, output OUT200, of circuit 200 and outputs OUT1, OUT2, OUT3 and OUTN of stages STAGE 1, STAGE 2, STAGE 3, and STAGE N, versus time, during step 410.

At time t1, signal START OSCILLATION takes a high value (rising edge). Circuit 200 outputs a signal comprising a pattern, for example, square. The signal then crosses all the stages 202 and circuit 200 to form a periodic signal having an oscillation period T1.

The signal comprising a pattern stops running through circuit 200 and thus stops its oscillation when signal START OSCILLATION takes a low value again (time t2).

The time period 510 between the rising edge of the pattern of output OUTN and the rising edge of the next pattern of output OUT200 corresponds to the propagation delay T200 introduced by circuit 200. Similarly, the time period between the rising edge of a pattern of the output of a first stage 202 and the rising edge of the pattern of the output of a second stage, following the first stage, corresponds to the propagation delay introduced by the second stage. Thus, oscillation period T1 corresponds to the sum of the propagation delays introduced by circuit 200 and stages 202.

During step 412 (OBTAIN DELAY) of FIG. 4, the test device recovers, via a fourth terminal 106, the signal having run through all the stages and having returned to circuit 200. The test device thus recovers a first value T1, corresponding to the oscillation period of the signal, obtained by the following formula (Equation 7):

$$T1 = T200 + \sum_{i=1}^{M}(TSi + TSMi)$$

In formula Equation 7, value T200 is equal to the propagation delay introduced by circuit 200. For a stage i, value TSi is equal to the value of the longest propagation delay among the propagation delays introduced by paths 300 and 302, and value TSMi is equal to the value of the propagation delay introduced by multiplexer 304 when passing through the input connected to the considered path 300 or 302.

Steps 414 (SELECTION OTHER PATH), 416 (START OSCILLATION), and 418 (OBTAIN DELAY) are then implemented. Steps 414, 416, and 418 respectively correspond to steps 408, 410, and 412 in the case where the multiplexer of each stage is configured to transmit the signal of the other path, here the path introducing the shortest propagation delay. Thus, the test device receives a second value T2 obtained by the following formula (Equation 8):

$$T2 = T200 + \sum_{i=1}^{M}(TFi + TFMi)$$

In formula Equation 8, value T200 is equal to the propagation delay caused by circuit 200. Value T200 is equal to the value T200 of formula Equation 7. For a stage i, value TFi is equal to the value of the shortest propagation delay among the propagation delays introduced by paths 300 and 302 and value TFMi is equal to the value of the propagation delay introduced by multiplexer 304 when passing through the input connected to the considered path 300 or 302.

During a step 420, the test device subtracts the propagation delay obtained for the paths introducing the shortest propagation delays to the propagation delay obtained for the paths introducing the longest propagation delays. The test device may also divide the value obtained by the subtraction by the number of pairs of component assemblies N. The operations performed by the test device correspond to the following formula (Equation 9):

$$D = \frac{1}{N}(T1 - T2)$$

$$D = \frac{1}{N}\left(T200 + \sum_{i=1}^{N}(TSi + TSMi)\right) - \frac{1}{N}\left(T200 + \sum_{i=1}^{N}(TFi + TFMi)\right)$$

This formula may also be written as follows (Equation 10):

$$D = \frac{1}{N}\left(\sum_{i=1}^{N}(TSi + TFi)\right) + \frac{1}{N}\left(\sum_{i=1}^{N}(TSMi - TFMi)\right)$$

The first sum corresponds to formula Equation 6. The second sum is considered as zero by approximation, the multiplexer being configured so that the two inputs substantially generate the same propagation delay.

The test device thus obtains value D representative of the dispersion. As a variation, it is possible for the test device to perform the division by N.

Except for the subtraction and, possibly for the division, all the calculations are performed in the actual stages during the passage of the periodic signal. Indeed, the series coupling of the stages causes the calculation of the sum of the propagation delays.

An advantage of the described embodiments is that they only comprise two value measurements for each test structure, and only the presence of four connection terminals per test structure. The standard deviation could have been calculated. However, the calculation of the standard deviation requires calculating a square and a square root, which are difficult to implement. The calculation should thus have been digitally performed. Each value xi should thus have been measured and then transmitted to the test device so that the test device digitally performs the calculations. This would imply the presence of connection terminals for each assembly of components, which would cost time and substrate surface area to measure each value.

Similarly, the calculation of the Gini mean difference would imply taking each propagation delay value to be able to obtain the absolute value of the difference between the values of the propagation delays of each pair of component assemblies.

Figure 6:
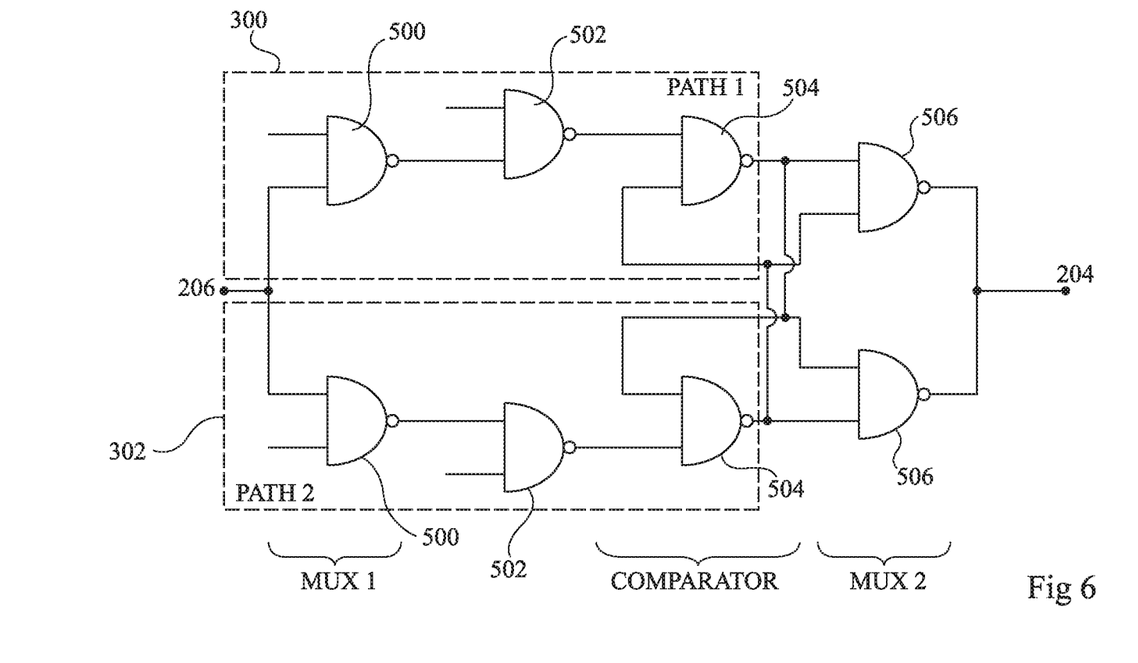
FIG. 6 illustrates in further detail a portion of the device of FIG. 3.

FIG. 6 illustrates in further detail a portion of the device of FIG. 3. More particularly, FIG. 6 illustrates an example of implementation, for a stage, of the circuit formed by paths 300 and 302, comparator 306, and multiplexer 304.

The circuit comprises two parallel branches connected together to input 206 and to output 204.

Each of the branches here comprises logic gates, for example, NAND gates. Each branch comprises a first gate 500, having an input connected to input 206 and having an output connected to an input of a second gate 502. A third gate 504 is connected, by an input, to an output of second gate 502 and, by an output, to an input of a fourth gate 506. An output of fourth gate 506 is connected to output 204. Another input of gate 504 is connected to another input of gate 506 and to another input of gate 500 of the other branch.

In this example, the gates 504 of the two branches form comparator 306 and the gates 500 and 506 of the two branches form the multiplexer. For each branch, gates 500, 502, and 504 form path 300 or 302.

Preferably, in the case where the logic gates are NAND gates, each branch comprises an even number of logic gates.

Thus, the output signal is the same signal as that supplied as an input, and not an inverted signal.

Another solution would have been to add comparators and multiplexers formed by components, for example, logic gates, which do not belong to paths 300 and 302. However, such components would have added propagation delays and error risks. Further, more components would then have had to be manufactured, which would have been more expensive and would have taken more space in the structure.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An apparatus for determining a value representative of dispersion of a propagation delay of assemblies of electronic components, comprising:
    at least one component test structure, wherein each component test structure comprises stages of components and a logic circuit connected in a ring, wherein each stage comprises two assemblies of electronic components configured to propagate a signal, the two assemblies of electronic components being formed by same components coupled in a same way but having different characteristics as a result of manufacturing differences; and
    a test device configured to obtain values of the at least one component test structure related to propagation delay of the signal propagated through the two assemblies of electronic components, and to perform operations on these values to thereby determine the value representative of the dispersion of the propagation delay of the signal through the two assemblies of electronic components.

2. The apparatus of claim 1, comprising a wafer of electronic chips, each electronic chip of the wafer comprising at least one of the at least one component test structures.

3. The apparatus of claim 1, wherein each component test structure comprises four terminals of connection to the test device and two power supply terminals.

4. The apparatus of claim 1, wherein each stage comprises a comparator, a memory circuit configured to store data, and a multiplexer.

5. The apparatus of claim 4, wherein the comparator is formed from the two assemblies of electronic components.

6. The apparatus of claim 4, wherein at least a portion of the multiplexer is formed from two assemblies of electronic components.

7. A method of determining a value representative of dispersion of a propagation delay of assemblies of electronic components, wherein the method is implemented by a device comprising: at least one component test structure, wherein each component test structure comprises stages of components and a logic circuit connected in a ring, wherein each stage comprises two assemblies of electronic components configured to conduct a signal; and a test device configured to obtain values of the at least one component test structure and to perform operations on these values; wherein each pair of assemblies of electronic components is formed by the two assemblies of electronic components of a stage; wherein each stage comprises a comparator, a memory circuit configured to store data, and a multiplexer, the method comprising:
    calculating a difference between a sum of longest propagation delays of each pair among pairs of assemblies of electronic components, and a sum of shortest propagation delays in each pair among pairs of assemblies of electronic components, the pairs of assemblies of electronic components being formed by same components coupled in a same way but having different characteristics as a result of manufacturing differences;
    sending a signal into the stages;
    comparing with the comparator of each stage to determine a path where the signal propagates faster; and
    storing information resulting from comparing in the memory circuit.

8. The method of claim 7, wherein the value representative of the dispersion is obtained by:

$$D = \frac{1}{N}\left(\sum_{i=1}^{N} ai - \sum_{i=1}^{N} bi\right)$$

where N is equal to a number of stages, and where values ai and bi are, for a pair of assemblies of electronic components i, the propagation delays of the assemblies of electronic components, value ai being greater than value bi.

9. The method of claim 7, comprising:
    generating a periodic signal running through the stages, the multiplexer of each stage being configured to conduct the signal through one among the assembly of electronic components having the longest propagation delay and the assembly of electronic components having the shortest propagation delay, the signal having a first oscillation period value after a passage through all the stages; and
    generating a periodic signal running through the stages, the multiplexer of each stage being configured to conduct the signal through the other one among the assembly of electronic components having the longest propagation delay and the assembly of electronic components having the shortest propagation delay, the signal having a second oscillation period value after a passage through all the stages.

10. The method of claim 9, wherein the test device calculates the value representative of the dispersion of the propagation delay from the first and second oscillation period values.

11. The method of claim 7, wherein each component assembly belongs to a single pair of assemblies.

12. The method of claim 7, wherein part of the calculation of the value representative of the dispersion is performed by the electronic components.

13. The method of claim 7, wherein the value representative of the dispersion is obtained by the following formula:

$$D = \frac{1}{N}\left(\sum_{i=1}^{N} ai - \sum_{i=1}^{N} bi\right)$$

where N is equal to a number of stages, and where values ai and bi are, for a pair of assemblies of electronic components i, the propagation delays of the assemblies of electronic components, value ai being greater than value bi.

14. An apparatus for determining a value representative of dispersion of a propagation delay of assemblies of electronic components, comprising:
   at least one component test structure, wherein each component test structure comprises:
      stages of components and a logic circuit connected in a ring, wherein each stage comprises two assemblies of electronic components, the two assemblies of electronic components being formed by same components coupled in a same way but having different characteristics as a result of manufacturing differences, and wherein each assembly of electronic components is configured to conduct a signal to an output of that assembly of electronic components, and
      a multiplexer having inputs coupled to outputs of the two assemblies of electronic components of the stage; and
   a test device configured to obtain values of the at least one component test structure and to perform operations on these values to thereby determine the value representative of the dispersion of the propagation delay of the two assemblies of electronic components;
   wherein each multiplexer is configured to:
      select during a first phase the input which is connected to the assembly of said two assemblies of electronic components having a shortest propagation delay; and
      select during a second phase the input which is connected to the assembly of said two assemblies of electronic components having a longest propagation delay.

15. The apparatus of claim 14, wherein each stage is further configured to determine the assembly of said two assemblies of electronic components having the shortest propagation delay.

16. The apparatus of claim 14, comprising a wafer of electronic chips, each electronic chip of the wafer comprising at least one of the component test structures.

17. The apparatus of claim 14, wherein each component test structure comprises four terminals of connection to the test device and two power supply terminals.

18. The apparatus of claim 14, wherein each stage comprises, along with said multiplexer, a comparator and a memory circuit configured to store data.

19. The apparatus of claim 18, wherein the comparator is formed from the two assemblies of electronic components.

20. The apparatus of claim 18, wherein at least a portion of the multiplexer is formed from two assemblies of electronic components.

* * * * *